United States Patent
Cheng

(10) Patent No.: US 7,242,545 B1
(45) Date of Patent: Jul. 10, 2007

(54) ASYMMETRIC COMPENSATION CIRCUIT

(75) Inventor: Chi Fung Cheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/617,333

(22) Filed: Dec. 28, 2006

Related U.S. Application Data

(63) Continuation of application No. 10/701,491, filed on Nov. 5, 2003, now Pat. No. 7,161,752.

(51) Int. Cl.
*G11B 5/09* (2006.01)
(52) U.S. Cl. .......................... 360/46; 360/65; 360/67; 360/68
(58) Field of Classification Search ...................... None
See application file for complete search history.

(56) References Cited

U.S. PATENT DOCUMENTS

| | | | |
|---|---|---|---|
| 4,528,515 A * | 7/1985 | Gross | ......................... 330/254 |
| 5,736,899 A | 4/1998 | Bowers et al. | |
| 5,744,993 A | 4/1998 | Sonntag | |
| 5,790,335 A | 8/1998 | Sugawara et al. | |
| 5,801,896 A | 9/1998 | Freitas | |
| 6,040,732 A | 3/2000 | Brokaw | |
| 6,043,943 A | 3/2000 | Rezzi et al. | |
| 6,052,245 A | 4/2000 | Sugawara et al. | |
| 6,072,647 A | 6/2000 | Hiramatsu | |
| 6,141,167 A | 10/2000 | Nishida et al. | |
| 6,147,828 A | 11/2000 | Bloodworth et al. | |
| 6,188,280 B1 | 2/2001 | Filip | |
| 6,366,417 B1 | 4/2002 | Mathews et al. | |
| 6,400,518 B1 | 6/2002 | Bhaumik et al. | |
| 6,510,012 B1 | 1/2003 | Chaiken et al. | |
| 6,519,106 B1 | 2/2003 | Goh et al. | |
| 6,529,340 B2 | 3/2003 | Gowda et al. | |
| 6,538,491 B1 | 3/2003 | Spanoche | |
| 6,587,292 B1 | 7/2003 | Ashley et al. | |
| 6,667,842 B2 * | 12/2003 | Comeau et al. | ................ 360/67 |
| 6,707,623 B2 | 3/2004 | Pisati et al. | |
| 6,721,117 B2 | 4/2004 | Briskin | |
| 6,747,515 B2 | 6/2004 | Callahan, Jr. | |
| 6,831,507 B2 * | 12/2004 | Granville | ........................ 330/9 |
| 6,958,644 B2 | 10/2005 | Palaskas et al. | |
| 6,972,625 B2 | 12/2005 | Nguyen et al. | |
| 7,079,342 B1 | 7/2006 | Han et al. | |
| 7,092,180 B2 | 8/2006 | Franck | |
| 7,099,098 B2 * | 8/2006 | Posat et al. | ................... 360/46 |
| 2002/0053935 A1 | 5/2002 | Katakura et al. | |
| 2002/0084842 A1 | 7/2002 | Yao et al. | |

* cited by examiner

*Primary Examiner*—Andrea Wellington
*Assistant Examiner*—Dismery Mercedes

(57) ABSTRACT

An apparatus, method, and system for providing asymmetric signal correction in a HDD system using magneto-resistive (MR) heads for reading information stored thereon. The MR head produces a signal that is asymmetric, and an asymmetric correction circuit corrects the asymmetric signal for further processing. The asymmetric correction circuitry comprises a differential amplifier having a variable gain for producing a current proportional to the asymmetric signal. The differential amplifier is coupled with two high speed switches for producing an output signal having only positive polarity. When the asymmetric correction output signal combines with the input signal, the resultant signal approximates the inverse distortion of the asymmetric input signal.

37 Claims, 5 Drawing Sheets

ASYMMETRIC COMPENSATION CIRCUIT

CROSS-REFERENCE TO RELATED APPLICATIONS

This application is a continuation of U.S. application Ser. No. 10/701,491 filed Nov. 5, 2003 now U.S. Pat. No. 7,161,752.

BACKGROUND OF THE INVENTION

1. Field of the Invention

This invention relates in general to the field of information storage, and more particularly to correcting an asymmetric signal resulting from the use of magneto-resistive (MR) transducing heads in hard disk drives (HDD), and more particularly in HDD read channels.

2. Description of the Related Art

FIG. 10 shows a schematic representation of a typical HDD, including at least one disk 1006 having a magnetic medium for storing information, a spindle, a motor 1007, and a controller 1008 for controlling disk rotational speed, a transducing head 1005 (for reading and writing data), a servo actuator assembly including a positioning controller for positioning the head over the appropriate disk track 1004, and data channels 1003 for transmitting data to and from the disk. The transducing head 1005 reads data from and writes data to the disk in data blocks having either fixed or variable length. A data block comprises a preamble (for acquiring timing signals), timing bits, a position error field, address bits, data bits, and error correction bits. Data blocks are recorded in sectors in concentric tracks. A track may comprise several sectors. The number of sectors may depend on the radial location of the track on the disk.

Data channels on an HDD transmit and receive data via a communication medium. HDD and communication systems can utilize similar techniques to encode data for storage and retrieval or for transmission and reception wherein data is encoded into a form in which it may be easily manipulated. Most modern applications of such systems encode data as numeric or digital information, wherein discrete numeric values are used to represent user data.

The storage or communication media do not directly manipulate such digital data. Rather, these media store or transmit analog signals representative of the digital data. For example, encoded digital information may be represented as magnetic flux changes stored in the magnetic media of a hard drive. The data embodied in the medium are then received or retrieved to decode the signals and reproduce the encoded digital data. A read channel is a circuit that reads or receives the encoded data and reproduces the original digital signal. In general, a read channel includes a transducer component that senses the analog signal and digital processing components that detect sequences of changes in the signal that represent encoded digital data. For example, a read channel used in a magnetic storage device includes a transducer head that senses the magnetic flux changes and produces a continuous analog signal that must then be detected and decoded. In general, certain peaks in the continuous waveform represent the encoded digital data.

Transducing heads may be either inductive or magneto-resistive (MR). An MR head is a device whose resistance varies with the applied magnetic field. In this regard, the head is capable of converting magnetic field variations produced by data into a time varying voltage or current in an electrical circuit. MR heads offer many advantages over other types of magnetic transducers and, consequently, are increasingly being used in HDDs. For example, MR heads are more sensitive than other types of read heads, such as thin film heads, and produce a stronger read signal. Also, MR heads have a better frequency response than other types of heads which use inductive coils as a sensing means. In addition, the read signal produced by an MR head is relatively insensitive to the relative velocity between the head and the medium, than is the case with other types of heads, because it is the level of the applied magnetic field which is sensed by an MR head and not the rate of change of magnetic flux lines through a coil. This is an advantage in systems where head/medium velocity may vary over a significant range. Lastly, because MR heads are not capable of writing data on a magnetic medium, magnetic data storage systems using MR read heads must include a separate write head thereby making it possible to optimize the read head and the write head for their particular functions.

A disadvantage of an MR read head is that it produces a signal with an asymmetric amplitude. For example, the asymmetric nature of the MR head may cause the signal produced by the read head reading data to be different than the magnetic signal applied to the write head for writing data. To overcome this problem, a bias current may be applied to the head to move the quiescent operating point of the head to be more asymmetric of the resistance characteristic. However, due to variation in the microstructure and magnetic properties of the recording medium and other manufacturing variables, biasing cannot completely remove the asymmetric aspect of the signal.

One approach is to use a filter having varying tap weights to change the shape of the waveform. Another variation is having a digital filter differentiate the waveform into sample and recreate an equalized waveform. Both these approaches are relatively complex.

Another approach provides circuitry to detect the polarity of an asymmetric signal and to add or subtract a shift voltage to adjust for the asymmetry.

A disadvantage of these approaches is that the corrective circuitry is dependent upon layout and process parameters that are difficult to control. Therefore, a need exists to address the asymmetric signal effects produced by such MR heads by providing circuitry to overcome the problems and limitations of the prior art.

SUMMARY OF THE INVENTION

To address the stated need and fulfill other desired objectives, in accordance with the invention, a communications read channel provides circuitry for correcting an asymmetric signal from an MR head thereby reducing errors in read channels. The circuitry comprises a differential amplifier portion and a high speed switching portion for converting an asymmetric signal having a positive and a negative polarity into a signal having only a positive polarity.

DETAILED DESCRIPTION OF EMBODIMENTS

Figure 1:
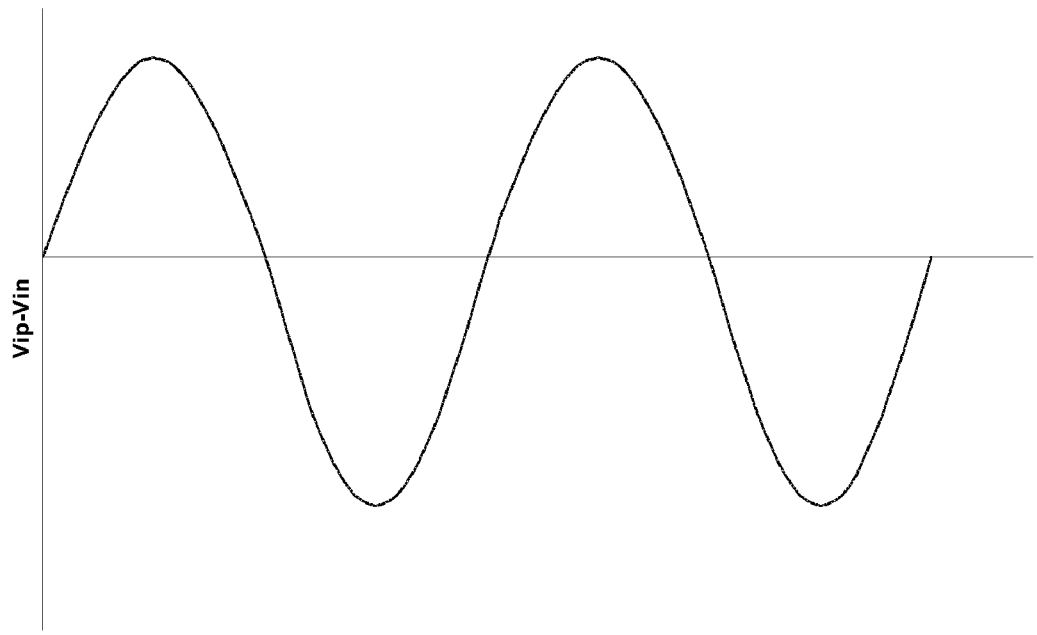
FIG. 1 shows an asymmetric signal from an MR read head.
Figure 2:
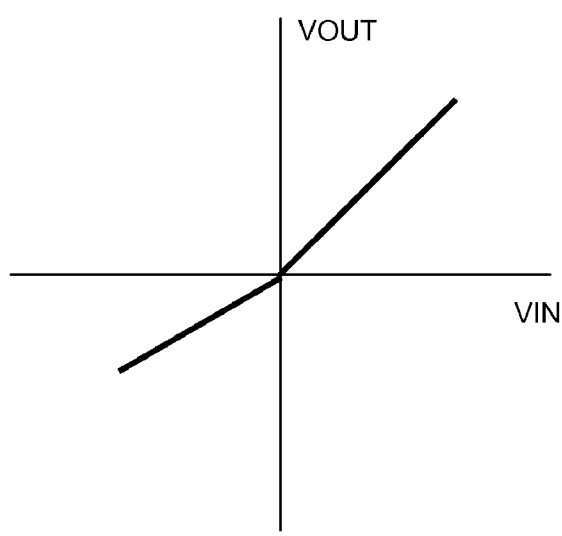
FIG. 2 shows a gain transfer function for an amplifier to correct an asymmetric signal.

In a read channel having an MR head, the MR head provides a differential input signal having a positive signal, Vip, and a negative signal, Vin, with the maximum values of each being different thereby defining the asymmetric distortion of the signal. The time varying input signal is shown in FIG. 1. In order to remove the asymmetry, the signal passes through an amplifier having a gain for the negative portion of the signal that is different than the gain for the positive portion of the signal. Such an amplifier may have a gain transfer function as shown in FIG. 2. An amplifier having a differential gain removes the asymmetric distortion from the signal.

Figure 3:
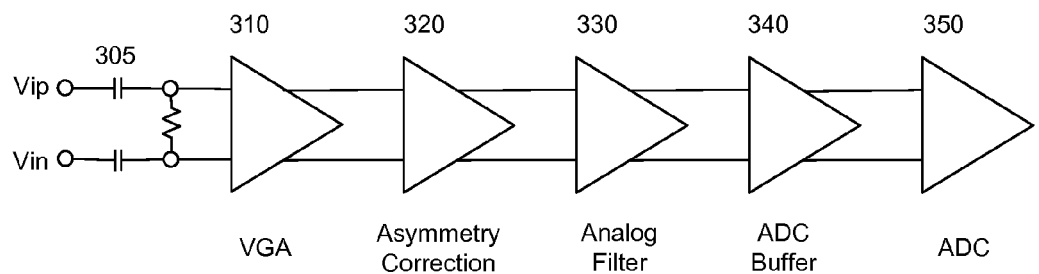
FIG. 3 shows a block diagram of a portion of a read channel circuit having asymmetric correction.

A block diagram of a circuit for reducing the asymmetry is shown in FIG. 3. A variable gain amplifier (VGA) 310, receives the input signal, Vip-Vin, through a loading circuit 305, and provides the input to an asymmetry correction circuit (ASC) 320. The ASC 320 is an amplifier having a gain for the negative portion of the signal different from the gain for the positive portion of the signal, thereby removing the asymmetric distortion. The corrected signal passes in turn to an analog filter (AF) 330, an analog-to-digital converter buffer 340, and to the analog-to-digital converter (ADC) 350. The signal from the MR head is now corrected for asymmetric distortion.

Figure 4:
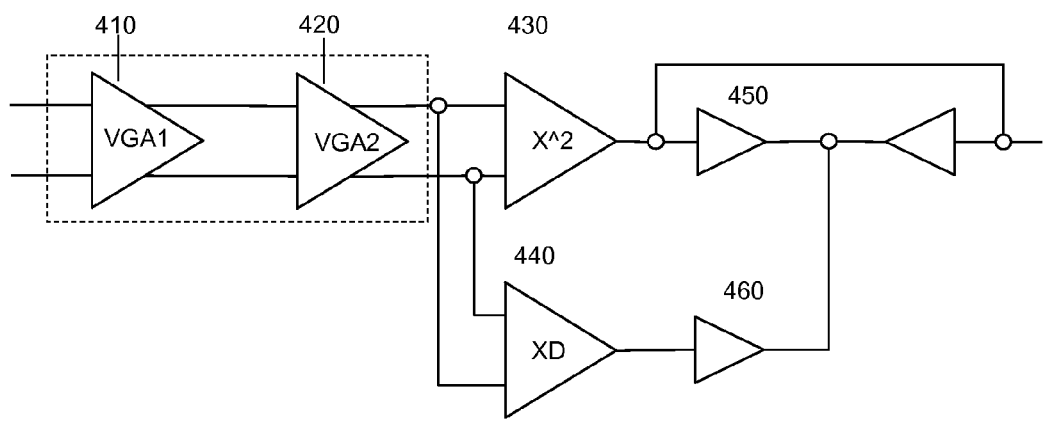
FIG. 4 shows a block diagram of circuitry currently used for implementing asymmetric correction.
Figure 7:
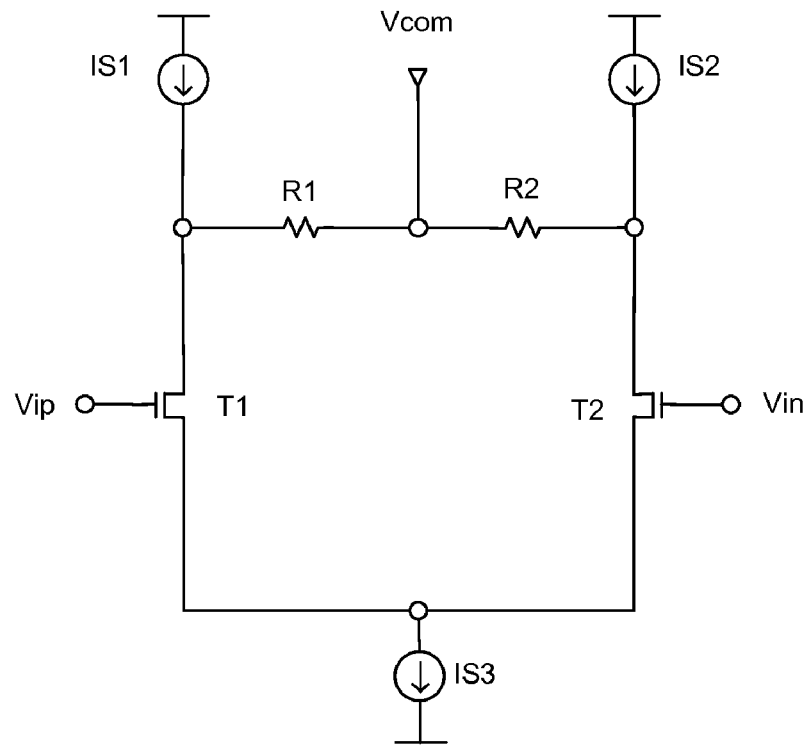
FIG. 7 shows a typical differential amplifier used in the inventive circuitry.

FIG. 4 shows a present implementation of asymmetry correction circuitry. A first variable gain amplifier 410 receives an asymmetric signal from an MR head, and provides an output to a second variable gain amplifier 420. While the drawing shows two VGAs, the system can use a single, two-stage VGA, potentially providing a larger range. The second amplifier 420 provides the signal to a squaring device 430 and to a delay circuit 440. The squaring device 430 provides an output that is proportional to a gain g times the square of the input and has only a positive polarity. The delay circuit 440 accounts for the delay in squaring the signal. The outputs of each of the squaring device 430 and the delay circuit 440 drive output amplifiers whose outputs are summed. Each of amplifiers 410, 420, and the respective output amplifiers 450, 460 are differential amplifiers as shown in FIG. 7. The output amplifiers are necessary to ensure that the asymmetry correction circuitry is process independent.

Figure 5:
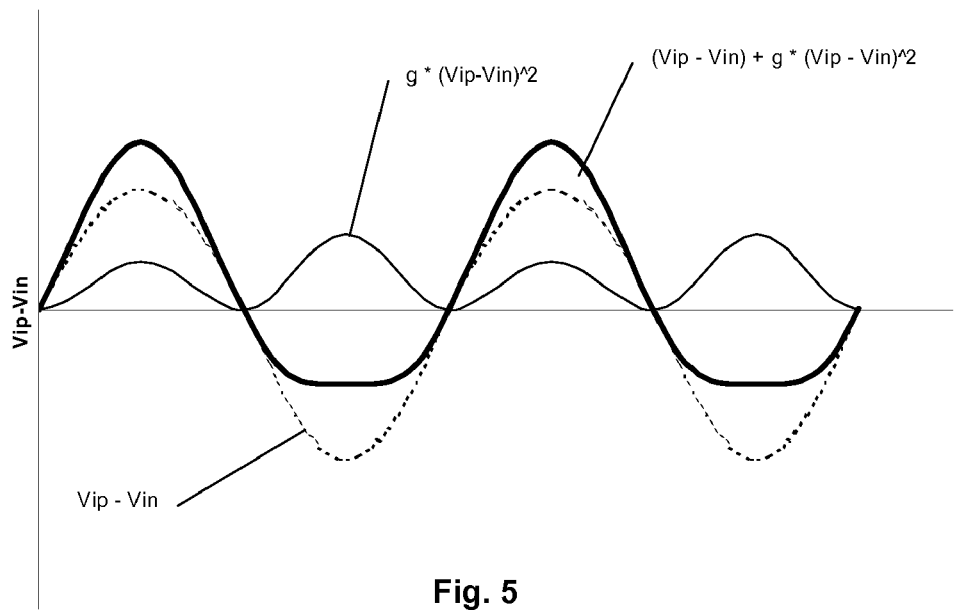
FIG. 5 shows signals and waveforms associated with the block diagram of FIG. 4.

FIG. 5 identifies the signals associated with a present implementation for correcting an asymmetric signal. The asymmetric signal is (Vip-Vin), and the square of this signal times a gain g, g*(Vip-Vin)^2, combines with the original signal to produce an output signal having a gain for the positive portion of the asymmetric signal different than the gain for the negative portion. The amount of positive and negative gain may be adjusted by varying the gain g of the squaring device 430.

Figure 6:
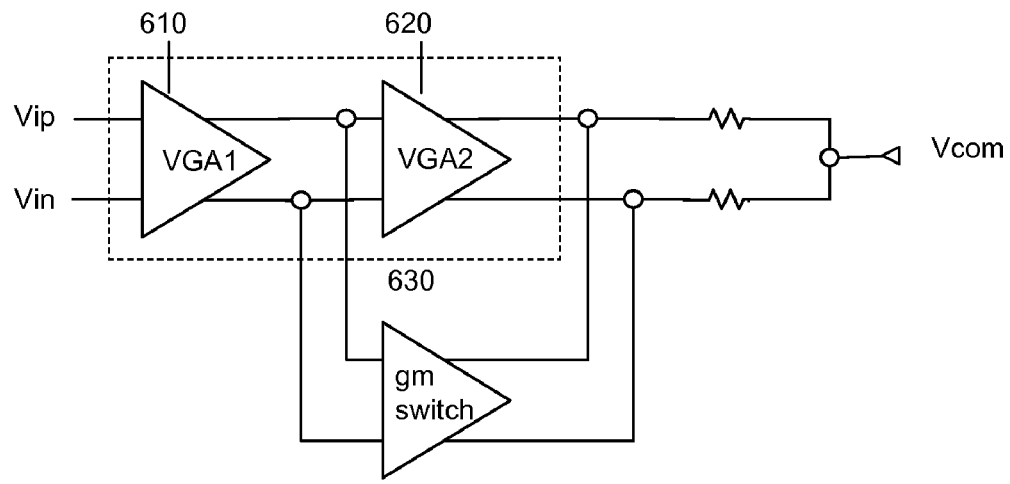
FIG. 6 shows a block diagram of one embodiment of the inventive circuitry.
Figure 8:
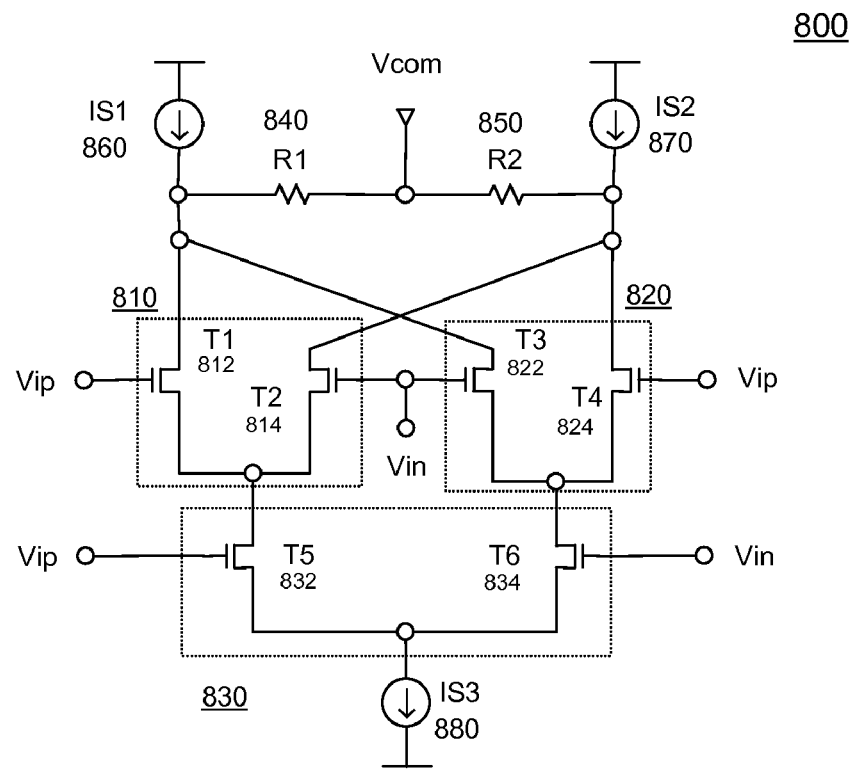
FIG. 8 shows detailed circuitry of the $g_m$ switch used in the inventive circuitry.
Figure 10:
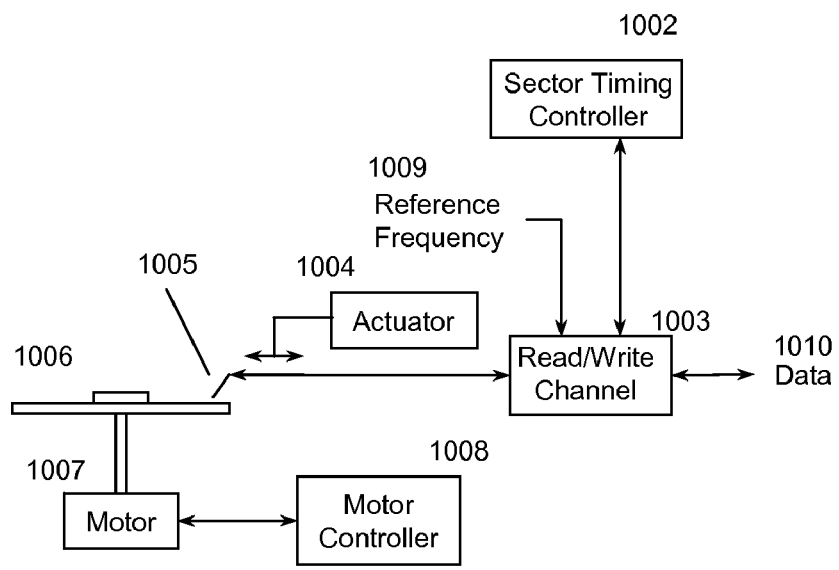
FIG. 10 shows a schematic representation of an HDD system.

In contrast, FIG. 6 shows the inventive circuit for the asymmetry correction circuitry, wherein a first variable gain amplifier 610 drives a second variable gain amplifier 620 and a $g_m$ switch 630 coupled in parallel to amplifier 620. Each of amplifiers 610 and 620 may be circuits as shown in FIG. 7. The $g_m$ switch 630 comprises a differential amplifier coupled with high speed switches as shown in FIG. 8. The output of the $g_m$ switch 630 combines with the output of amplifier 620 thereby providing a signal having corrected asymmetry.

Referring now to FIG. 8, the $g_m$ switch 630 receives the differential input signals Vip and Vin and uses the input signals to generate a current proportional to the difference of Vip-Vin. The input signals also control the switching functions of the $g_m$ switch.

The switching section further comprises two pair of high speed field effect transistors 810 (including transistors 812, 814) and 820 (including transistors 822, 824) for switching biasing current to the amplifier section. Each of the transistors 812, 814, 822, 824 is configured to have a sufficiently small linear range as measured by $V_{dstat}$ (the voltage required to keep the transistors in saturation) that the transistors can behave as a switch. These characteristics of the transistors 812, 814, 822, 824 cause biasing current to flow through only the transistors having a positive gate, and not through the transistors having a negative gate. Therefore, whichever transistors are conducting are passing all the current. The current is not shared by each of the transistors of the switching pair. Ordinarily skilled artisans will be familiar with these characteristics, and the requisite linear range.

The source of transistor 812 connects to a first current source 860, the source of transistor 814 connects to a second current source 870, and the drains of transistors 812 and 814 are connected together and further connected to the source of transistor 832, one of the transistors of the amplifier section. Similarly, the source of transistor 822 is also connected to the first current source 860, and the source of transistor 824 is connected to the second current source 870. The drains of transistors 822 and 824 are also connected together and further connected to the source of transistor 834 of the amplifier section. The gates of transistors 812 and 824 are connected to the Vip input signal, and the gates of transistors 814 and 822 are connected together and further connected to the Vin input signal. Biasing resistors 840 and 850 are connected between current sources 860 and 870, and voltage is supplied by a common mode voltage source, Vcom. Biasing resistors 840 and 850 typically have the same value, but they may also have different values.

The amplifier section 830 is a differential amplifier comprising a pair of field effect transistors 832, 834. The source of transistor 832 is connected to the drain of the first pair of switching transistors 810, and the source of transistor 834 is connected to the drain of the second pair of switching transistors 820. The drains of transistors 832 and 834 are connected together and further connected to a third current source 880. The gate of transistor 832 is connected to Vip and the gate of transistor 834 is connected to Vin.

The differential amplifier is responsive to the differential input signal, Vip and Vin, producing a differential current, δi, proportional to the transconductance (or gain $g_m$) of the transistor pair 830 times the differential signal input voltage Vip-Vin. Therefore, a positive differential current δi flows through transistor 832 and correspondingly, a negative differential current, -δi, flows through transistor 834 when Vip is positive and Vin is negative. Conversely, when Vip is negative and Vip is positive, -δi flows in transistor 832 and δi flows in transistor 834. Also, when Vip is positive, transistors 812 and 824 are conducting causing a current of 2×δi to flow across the biasing resistors 840 and 850. When Vin is positive, transistors 814 and 822 are conducting, also causing a current of 2×δi to flow across resistors 840 and 850. However, because of the high speed switching transistors reverse the current flow, the current flowing when Vin is positive flows in the same direction as when Vip is positive. Therefore, the current flows through resistors 840 and 850 in the same direction irrespective whether the inputs are positive or negative. The output signal, taken across the biasing resistors 840 and 850, is proportional to the current, which is proportional to the differential input signal Vip–Vin.

Figure 9:
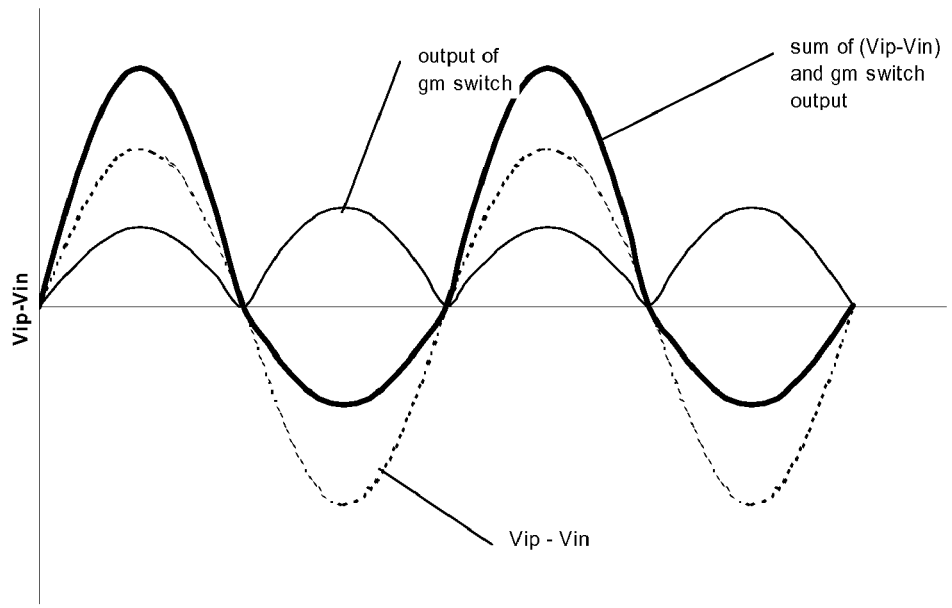
FIG. 9 shows signals and waveforms associated with the inventive circuitry of FIG. 6.

FIG. 9 shows the different signals of the circuitry shown in FIG. 6. The asymmetric input signal to amplifier 620 and the $g_m$ switch is Vip–Vin. The $g_m$ switch provides a signal that is proportional to Vip–Vin but having only a positive polarity. The sum of these two signals shows the asymmetric correction circuitry having a different gain for the positive portion of the signal than for the negative portion of the signal. The different positive and negative gains may be effected by varying the gain of the differential amplifier, $g_m$.

The gain of the differential amplifier 830 may be varied to accommodate varying degrees of asymmetry by adding, for instance, parallel transistors and switching the parallel transistors in or out of the circuit. This is one manner of altering the gain of the differential amplifier, however, other ways known in the art also may be used. Varying the gain will affect the amount of assymetry. Alternatives include varying IS3 in FIG. 8 in an amount proportional to the square of the current, or varying physical characteristics of transistors 832, 834 in differential amplifier 830 in an amount proportional to the square root of W/L, where W and L are known physical parameters.

While the invention has been described in detail above with reference to some embodiments, variations within the scope and spirit of the invention will be apparent to those of ordinary skill in the art. Thus, the invention should be considered as limited only by the scope of the appended claims.

I claim:

1. A $g_m$ switch comprising:
    a transconductance circuit for receiving an asymmetric signal and for providing a current proportional to the asymmetric signal in a first and a second current path;
    a first switching circuit, having a first and a second input, said first switching circuit being coupled to the first current path;
    a second switching circuit, having a third and a fourth input, said second switching circuit being coupled to the second current path;
    a first current source coupled to the first and the third inputs; and
    a second current source coupled to the second and fourth inputs;
    wherein the first switching circuit is responsive to the asymmetric signal for switching the first current source to the first current path or to the second current path, and
    wherein the second switching circuit is responsive to the asymmetric signal for switching the second current source to the first current path or to the second current path.

2. The switch of claim 1, wherein the first switching circuit is responsive to a polarity of the asymmetric signal.

3. The switch of claim 2, wherein the first switching circuit switches the first input to the first current path when the polarity is positive.

4. The switch of claim 2, wherein the first switching circuit switches the second input to the first current path when the polarity is negative.

5. The switch of claim 1, wherein the second switching circuit is responsive to a polarity of the asymmetric signal.

6. The switch of claim 5, wherein the second switching circuit switches the third input to the second current path when the polarity is negative.

7. The switch of claim 5, wherein the second switching circuit switches the fourth input to the second current path when the polarity is positive.

8. The switch of claim 1, wherein the first switching circuit further comprises a pair of field effect transistors arranged to have a sufficiently small linear range to enable the transistors to operate as a switch.

9. The switch of claim 1, wherein the second switching circuit further comprises a pair of field effect transistors arranged to have a sufficiently small linear range to enable the transistors to operate as a switch.

10. A read channel comprising a circuit for correcting an asymmetric signal from a transducing head, said circuit comprising:
    a variable gain amplifier circuit for receiving said asymmetric signal from said transducing head and providing first and second outputs; and
    a $g_m$ switch coupled to the first output of the first variable gain amplifier circuit and providing an output having only a first polarity,
    wherein the second output of the variable gain amplifier circuit and the output of the $g_m$ switch are combined to provide a corrected signal.

11. The read channel of claim 10, wherein said $g_m$ switch comprises:
    a first switching circuit;
    a second switching circuit; and
    a differential amplifier coupled to said first and second switching circuits.

12. The read channel of claim 11, wherein each of said first and second switching circuits comprises at least one transistor operated in saturation.

13. The read channel of claim 10, wherein said variable gain amplifier circuit comprises first and second variable gain amplifiers coupled in series and providing said first and second outputs, respectively.

14. The read channel of claim 10, wherein said variable gain amplifier circuit comprises a two-stage variable gain amplifier, a first stage providing said first output and a second stage providing said second output.

15. The read channel of claim 10, wherein the $g_m$ switch comprises:
    a transconductance circuit for receiving the asymmetric signal and for providing a current proportional to the asymmetric signal in a first and a second current path;
    a first switching circuit, having a first and a second input, said first switching circuit being coupled to the first current path;
    a second switching circuit, having a third and a fourth input, said second switching circuit being coupled to the second current path;
    a first current source coupled to the first and the third inputs; and
    a second current source coupled to the second and fourth inputs;
    wherein the first switching circuit is responsive to the asymmetric signal for switching the first current source to the first current path or to the second current path, and wherein the second switching circuit is responsive to the asymmetric signal for switching the second current source to the first current path or to the second current path.

16. The read channel of claim 15, wherein the first switching circuit is responsive to a polarity of the asymmetric signal.

17. The read channel of claim 16, wherein the first switching circuit switches the first input to the first current path when the polarity is positive.

18. The read channel of claim 16, wherein the first switching circuit switches the second input to the first current path when the polarity is negative.

19. The read channel of claim 15, wherein the second switching circuit is responsive to a polarity of the asymmetric signal.

20. The read channel of claim 19, wherein the second switching circuit switches the third input to the second current path when the polarity is negative.

21. The read channel of claim 19, wherein the second switching circuit switches the fourth input to the second current path when the polarity is positive.

22. The read channel of claim 15, wherein the first switching circuit further comprises a pair of field effect transistors arranged to have a sufficiently small linear range to enable the transistors to operate as a switch.

23. The read channel of claim 15, wherein the second switching circuit further comprises a pair of field effect transistors arranged to have a sufficiently small linear range to enable the transistors to operate as a switch.

24. A hard disk drive comprising:
at least one disk having a surface for storing data thereon;
at least one read head for reading information recorded in data tracks on the at least one disk;
a servo actuator for positioning the at least one read head with respect to the at least one disk; and
a read channel for transmitting data from the at least one read head;
wherein the read channel comprises a circuit for correcting an asymmetric signal received from said read head, said circuit comprising:
a variable gain amplifier circuit for receiving said asymmetric signal and providing first and second outputs; and
a $g_m$ switch coupled to the first output of the first variable gain amplifier circuit and providing an output having only a first polarity,
wherein the second output of the variable gain amplifier circuit and the output of the $g_m$ switch are combined to provide a corrected signal.

25. The hard disk drive of claim 24, wherein said $g_m$ switch comprises:
a first switching circuit;
a second switching circuit; and
a differential amplifier coupled to said first and second switching circuits.

26. The hard disk drive of claim 25, wherein each of said first and second switching circuits comprises at least one transistor operated in saturation.

27. The hard disk drive of claim 24, wherein said variable gain amplifier circuit comprises first and second variable gain amplifiers coupled in series and providing said first and second outputs, respectively.

28. The hard disk drive of claim 24, wherein said variable gain amplifier circuit comprises a two-stage variable gain amplifier, a first stage providing said first output and a second stage providing said second output.

29. The hard disk drive of claim 24, wherein the $g_m$ switch comprises:
a transconductance circuit for receiving the asymmetric signal and for providing a current proportional to the asymmetric signal in a first and a second current path;
a first switching circuit, having a first and a second input, said first switching circuit being coupled to the first current path;
a second switching circuit, having a third and a fourth input, said second switching circuit being coupled to the second current path;
a first current source coupled to the first and the third inputs; and
a second current source coupled to the second and fourth inputs;
wherein the first switching circuit is responsive to the asymmetric signal for switching the first current source to the first current path or to the second current path, and
wherein the second switching circuit is responsive to the asymmetric signal for switching the second current source to the first current path or to the second current path.

30. The hard disk drive of claim 29, wherein the first switching circuit is responsive to a polarity of the asymmetric signal.

31. The hard disk drive of claim 30, wherein the first switching circuit switches the first input to the first current path when the polarity is positive.

32. The hard disk drive of claim 30, wherein the first switching circuit switches the second input to the first current path when the polarity is negative.

33. The hard disk drive of claim 29, wherein the second switching circuit is responsive to a polarity of the asymmetric signal.

34. The hard disk drive of claim 33, wherein the second switching circuit switches the third input to the second current path when the polarity is negative.

35. The hard disk drive of claim 33, wherein the second switching circuit switches the fourth input to the second current path when the polarity is positive.

36. The hard disk drive of claim 29, wherein the first switching circuit further comprises a pair of field effect transistors arranged to have a sufficiently small linear range to enable the transistors to operate as a switch.

37. The hard disk drive of claim 29, wherein the second switching circuit further comprises a pair of field effect transistors arranged to have a sufficiently small linear range to enable the transistors to operate as a switch.

* * * * *